United States Patent
Mitani et al.

(10) Patent No.: US 6,306,730 B2
(45) Date of Patent: Oct. 23, 2001

(54) METHOD OF FABRICATING AN SOI WAFER AND SOI WAFER FABRICATED BY THE METHOD

(75) Inventors: Kiyoshi Mitani; Isao Yokokawa, both of Gunma-ken (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 09/834,435

(22) Filed: Apr. 13, 2001

Related U.S. Application Data

(62) Division of application No. 09/346,576, filed on Jul. 1, 1999, now Pat. No. 6,245,645.

(30) Foreign Application Priority Data

Jul. 7, 1998 (JP) .................................................. 10-208711

(51) Int. Cl.[7] .................................................... H01L 21/30
(52) U.S. Cl. ........................ 438/458; 438/455; 438/977; 438/407; 148/33
(58) Field of Search .................................... 438/455, 458, 438/977, 406, 409, 407; 148/33

(56) References Cited

U.S. PATENT DOCUMENTS

| | | | |
|---|---|---|---|
| 5,374,564 | 12/1994 | Bruel | ..................................... 438/455 |
| 6,221,738 | * 4/2001 | Sakaguchi et al. | . |
| 6,225,192 | * 5/2001 | Aspar et al. | . |
| 6,251,754 | * 6/2001 | Ohshima et al. | . |

FOREIGN PATENT DOCUMENTS

| | | |
|---|---|---|
| 0-905767 | 3/1999 | (EP) . |
| 10-335616 | 12/1998 | (JP) . |

OTHER PUBLICATIONS

Auberton–Herve A.J. et al.: "Smart–Cut: The Basic Fabrication Process for Unibond SOI Wafers"/ IEICE Transactions On Electronics, JP, Institute of Electronics Information and Comm. Eng. Tokyo, vol. E80–C, No. 3, Mar. 1, 1997, pp. 358–363.

Di Cioccio L. et al.: "Silicon carbide on insulator formation by the Smart–Cut ® process"–Materials Science and Engineering B, CH, Elsevier Sequoia, Lausanne, vol. 46, No. 1–3/Apr. 1, 1997, pp. 349–356.

* cited by examiner

Primary Examiner—Tuan H. Nguyen
(74) Attorney, Agent, or Firm—Hogan & Hartson, L.L.P.

(57) ABSTRACT

There is disclosed a method of fabricating an SOI wafer in which a bond wafer to form a SOI layer and a base wafer to be a supporting substrate are prepared; an oxide film is formed on at least the bond wafer; hydrogen ions or rare gas ions are implanted in the bond wafer via the oxide film in order to form a fine bubble layer (enclosed layer) within the bond wafer; the ion-implanted surface is brought into close contact with the surface of the base wafer; and then heat treatment is performed to separate a thin film from the bond wafer with using the fine bubble layer as a delaminating plane to fabricate the SOI wafer having an SOI layer; and wherein deviation in the thickness of the oxide film formed on the bond wafer is controlled to be smaller than the deviation in the ion implantation depth, and the SOI wafer fabricated thereby. There is provided an SOI wafer which has an SOI layer having improved thickness uniformity.

1 Claim, 3 Drawing Sheets

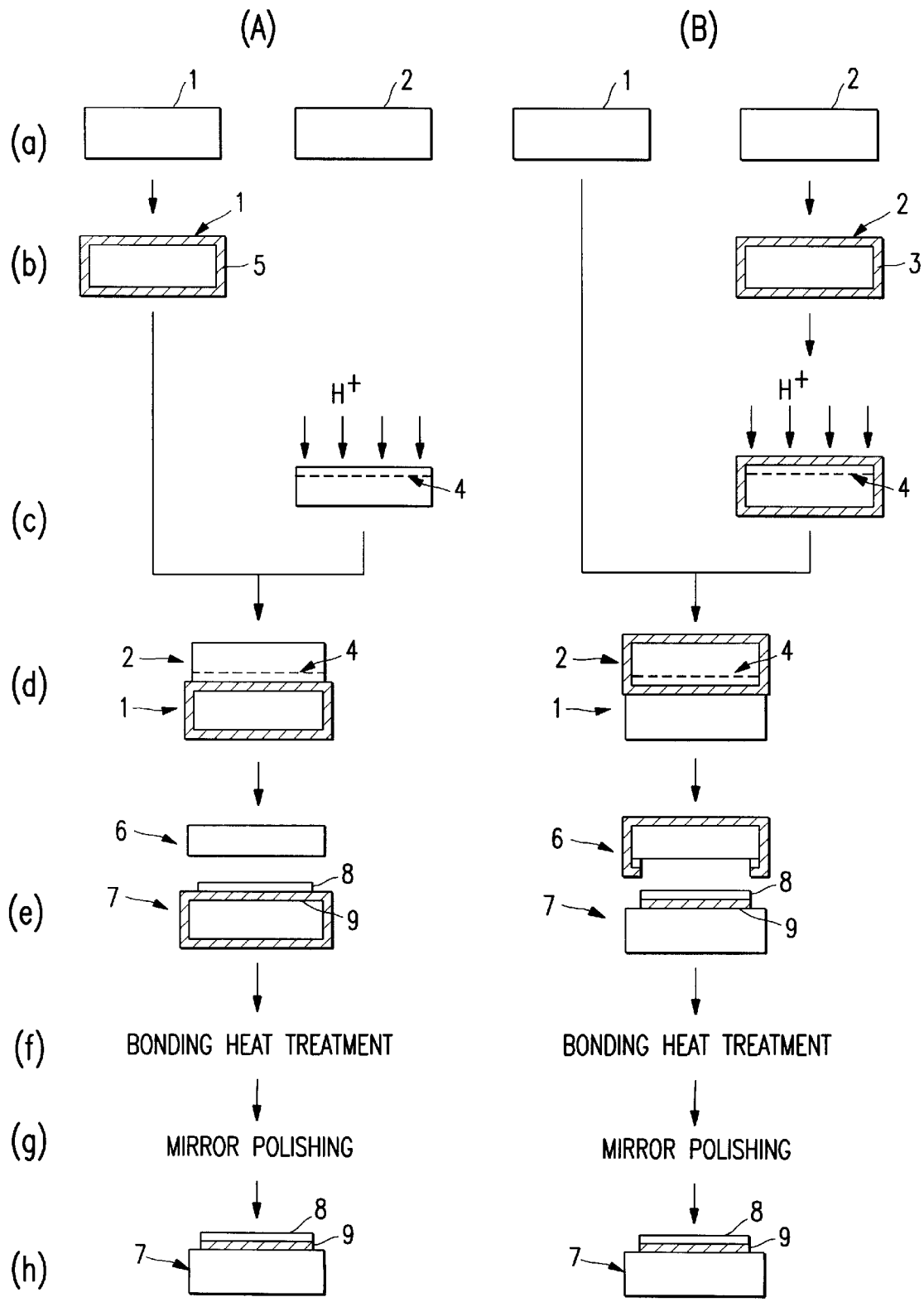

METHOD OF FABRICATING AN SOI WAFER AND SOI WAFER FABRICATED BY THE METHOD

This is a divisional of application Ser. No. 09/346,576 filed Jul. 1, 1999, now U.S. Pat. No. 6,245,645, which application is hereby incorporated by reference in its entirety.

BACKGROUND OF THE INVENTION

1. Field of the Invention

The present invention relates to an SOI (silicon on insulator) structure wafer obtained by a method wherein an ion-implanted wafer is bonded to another wafer and a portion of the ion-implanted wafer is delaminated (separated) to provide an SOI wafer (called a smart-cut method). More particularly, the present invention relates to a method of fabricating an SOI wafer having an active SOI layer which is excellent in thickness uniformity, and an SOI wafer having an active SOI layer which is excellent in thickness uniformity.

2. Description of the Related Art

Recently, a method of fabricating an SOI wafer in which an ion-implanted wafer is bonded to another wafer and a portion of the ion-implanted wafer is delaminated to provide an SOI wafer (hereinafter, occasionally referred to as an ion implantation and delamination method) has attracted attention. In this method, as shown in FIGS. 3(a) to (h), an oxide film is formed on the surface of at least one of two silicon wafers (FIG. 3(b)), which are a bond wafer 2 to form an SOI layer and a base wafer 1 to be a supporting substrate (FIG. 3(a)); hydrogen ions or rare gas ions are implanted into the bond wafer 2 in order to form a fine bubble layer (enclosed layer) 4 within the bond wafer (FIG. 3(c)); the ion-implanted wafer is superposed on the base wafer 1 such that the ion-implanted surface comes into close contact with the surface of the base wafer 1 via the oxide film (FIG. 3(d)); heat treatment is then performed to delaminate a portion of the bond wafer 2 as a thin film with using the fine bubble layer as a delaminating plane (FIG. 3(e)); heat treatment is further performed to firmly bond the wafers to each other (FIG. 3(f)), which are then subjected to mirror polishing (FIG. 3(g)) to thereby obtain an SOI wafer (FIG. 3(h)) (See Japanese Patent Application Laid-Open (kokai) No. 5-211128).

The above-mentioned method can be roughly classified into two methods depending on the wafer on which an oxide film is formed. In one of them, Method A, the oxide film is formed on the base wafer 1 as shown in FIG. 3(A), and in the other of them, Method B, it is formed on the bond wafer 2 as shown in FIG. 3(B). Method B wherein the oxide film is formed on the bond wafer in advance has been performed mainly.

Because, the depth of ion implantation varies widely due to a channeling effect, when the oxide film is not formed on the bond wafer in which ions are to be implanted, and as a result, thickness uniformity of the SOI layer may be lowered.

"The channeling effect" means herein a phenomenon wherein ions implanted parallel to the crystal axis of the crystalline material pass zigzag between the atoms of the crystal. In that case, the deviation in the ion implantation depth is larger, compared to the case that the ions are implanted nonparallel to the crystal axis. The phenomenon is apt to occur particularly in a silicon wafer, since the surface thereof is processed in a certain orientation (for example, <100>). Accordingly, it is preferable to form the oxide film on the wafer to suppress the channeling effect in that case.

Another reason why the oxide film should be formed on the bond wafer is that the oxide film previously formed on the bond wafer may suppress diffusion of impurities incorporated in the bonded surface (boron in atmosphere or metal impurities due to ion implantation) into the active layer (SOI layer), and therefore, degradation of crystallinity of the SOI layer and electronic characteristics can be prevented.

When the channeling effect is not caused, deviation (standard deviation) σ of the ion implantation depth in the ion implantation and delamination method can be 0.4 nm. Namely, 3σ=1.2 nm can be achieved, so that almost all of ions can be implanted at an intended depth ±1.2 nm. Accordingly, it is inferred that a super thin SOI wafer having good thickness uniformity of an intended thickness ±1.5 nm or less can be obtained according to the ion implantation and delamination method.

However, when the oxide film is formed on the bond wafer in which ions are to be implanted because of the above-mentioned reasons, there is a deviation also in the thickness of the formed oxide film, and the implantation depth of ions implanted in the silicon through the oxide film is also affected thereby.

For example, when a thickness of a buried oxide layer of an SOI wafer needs to be 400 nm, a standard deviation σ in the thickness of the oxide layer will be 2.0 nm at the smallest under oxidizing condition in general mass-production. Even if the oxidizing condition is precisely controlled without considering productivity, σ is around 1.0 nm at the smallest. Accordingly, a thickness uniformity of an SOI layer of a conventional SOI wafer produced with forming an oxide film on a bond wafer is around an intended thickness ±3 nm at the smallest.

SUMMARY OF THE INVENTION

The present invention has been accomplished to solve the above-mentioned problems, and a major object of the present invention is to provide a method of fabricating an SOI wafer that has an SOI layer with significantly improved thickness uniformity, by holding an influence of deviation in thickness of an oxide film formed on a bond wafer in the SOI wafer on thickness uniformity of the SOI layer to the minimum, and the SOI wafer.

To achieve the above mentioned object, the present invention provides a method of fabricating an SOI wafer in which a bond wafer to form a SOI layer and a base wafer to be a supporting substrate are prepared; an oxide film is formed on at least the bond wafer; hydrogen ions or rare gas ions are implanted in the bond wafer via the oxide film in order to form a fine bubble layer (enclosed layer) within the bond wafer; the ion-implanted surface is brought into close contact with the surface of the base wafer; and then heat treatment is performed to separate a thin film from the bond wafer with using the fine bubble layer as a delaminating plane to fabricate the SOI wafer having an SOI layer; and characterized in that deviation in the thickness of the oxide film formed on the bond wafer is controlled to be smaller than the deviation in the ion implantation depth.

As described above, in the method of fabricating an SOI wafer in which an oxide film is formed on a bond wafer in advance, if the deviation in the thickness of the oxide film formed on the bond wafer is controlled to be smaller than the deviation in the ion implantation depth, the influence of the deviation in the thickness of the oxide film on the thickness uniformity of the SOI layer can be held to the minimum, and thus the SOI wafer wherein thickness uniformity of the SOI layer is improved can be fabricated.

The term "deviation" herein means a standard deviation.

To achieve the above mentioned object, the present invention also provides a method of fabricating an SOI wafer in which a bond wafer to form a SOI layer and a base wafer to be a supporting substrate are prepared; an oxide film is formed on at least the bond wafer; hydrogen ions or rare gas ions are implanted in the bond wafer via the oxide film in order to form a fine bubble layer (enclosed layer) within the bond wafer; the ion-implanted surface is brought into close contact with the surface of the base wafer; and then heat treatment is performed to separate a thin film from the bond wafer with using the fine bubble layer as a delaminating plane to fabricate the SOI wafer having an SOI layer; and characterized in that a thickness of the oxide film formed on the bond wafer is defined so that deviation in the thickness of the oxide film formed on the bond wafer may be smaller than the deviation in the ion implantation depth.

As described above, in the method of fabricating the SOI wafer in which an oxide film is formed on a bond wafer in advance, when the thickness of the oxide film formed on the bond wafer is defined so that deviation in the thickness of the oxide film formed on the bond wafer may be smaller than the deviation in the ion implantation depth, the influence of the deviation in the thickness of the oxide film on the ion implantation depth can be held to the minimum, and thus the SOI wafer wherein thickness uniformity of the SOI layer is improved can be fabricated.

Preferably, an oxide film is previously formed on the base wafer which is to be bonded to the bond wafer, and the thickness of the oxide film formed on the base wafer is defined so that it can form the buried oxide layer with a desired thickness in the SOI wafer together with the oxide film formed on the bond wafer.

As described above, when the oxide film is previously formed on the base wafer, and the thickness of the oxide film formed on the base wafer is defined so that it can form the buried oxide layer with a desired thickness in the SOI wafer together with the oxide film formed on the bond wafer, the buried oxide layer having a desired thickness can easily be obtained, and thus problem of insufficient thickness of the oxide layer is not caused, and the influence of the deviation in the thickness of the oxide film of the bond wafer on the thickness uniformity of the SOI layer can be held to the minimum.

The thickness of the oxide film formed on the bond wafer is preferably 10 to 100 nm.

Although the deviation in the thickness of the oxide film and the deviation in the ion implantation depth vary depending on a used apparatus, conditions for ion implantation and oxidizing conditions for formation of the oxide film, in order to make the deviation in thickness of the oxide film smaller than the deviation in ion implantation depth when using an apparatus used in mass production, the thickness of the oxide film is preferably 100 nm or less. On the other hand, at least 10 nm of the thickness of the oxide film is necessary in order to prevent the channeling effect described above. Accordingly, the thickness of the oxide film is preferably 10 nm or more.

The present invention also provides an SOI wafer produced by the above mentioned methods, wherein the thickness uniformity of the SOI layer is high even when the buried oxide layer is thick.

The present invention also provides an SOI wafer produced by bonding two wafers according to the ion implantation and delamination method, which has a bonded surface in the buried oxide layer, or between the buried oxide layer and the base wafer. In the wafer, the thickness uniformity of the SOI layer is high as ±1.5 nm or less. Accordingly, device characteristics of the device fabricated therefrom are improved, and freeness in designing of the device is large.

As described above, according to the present invention, influence of the deviation in the thickness of the oxide film on the bond wafer on the deviation in the active SOI layer is small, even in the SOI wafer which requires thick buried oxide layer. Therefore, the SOI layer having the SOI layer with quite excellent thickness uniformity can be fabricated. Furthermore, device characteristics and freeness of the device design can be improved due to decrease of the deviation of the thickness of the SOI layer.

BRIEF DESCRIPTION OF THE DRAWINGS

FIGS. 3(a)–(h) is a flowchart showing an example of an SOI-wafer fabricating process according to an ion implantation and delamination method. (A) shows a method wherein an oxide film is formed on a base wafer. (B) shows a method wherein an oxide film is formed on a bond wafer.

DESCRIPTION OF THE INVENTION AND A PREFERRED EMBODIMENT

Figure 1:
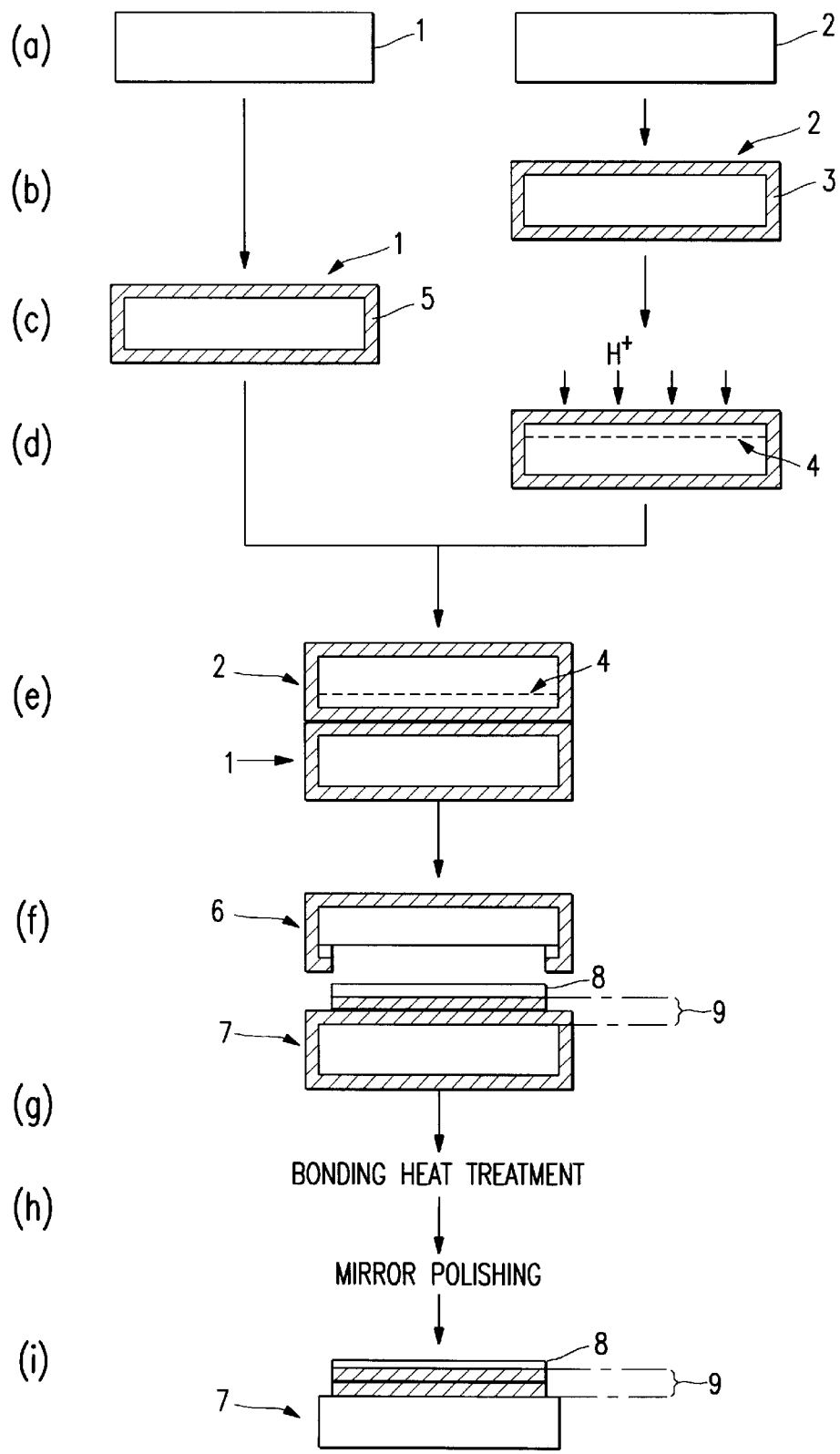
FIGS. 1(a)–(i) is a flowchart showing an example of an SOI-wafer fabricating process according to the method of fabricating an SOI wafer of the present invention.

The present invention will be further described below in detail, but is not limited thereto.

In fabrication of the SOI wafer, formation of the buried oxide layer having a thickness necessary for the SOI wafer under general oxidizing condition for mass production may results in far larger deviation in the thickness of the oxide film formed in the wafer than the deviation in the ion implantation depth. Accordingly, the thickness uniformity of the SOI layer may be significantly affected thereby.

Generally, the deviation in the thickness of a thicker oxide film is larger. Accordingly, the inventors of the present invention have thought of making the thickness of the oxide film formed on the bond wafer thin in order to make the deviation in the thickness of the oxide film smaller than the deviation in the implantation depth of ion implantation, and making up for a deficiency in the thickness of the buried oxide layer necessary for the SOI wafer by forming the oxide film on the base wafer, to obtain a buried oxide layer having a desired thickness in combination of the oxide film formed on the bond wafer and that formed on the base wafer.

For example, when the upper limit of the thickness of the oxide film in the case that the deviation in the implantation depth achieved by an ion implanter used for fabrication of SOI wafer is 0.4 nm and the deviation in the oxide film formed on the bond wafer is 0.4 nm or less, is 100 mn, the thickness of the oxide film of 100 nm or less can be selected as the thickness of the oxide film formed on the bond wafer.

In that case, when the thickness of the oxide film on the bond wafer is defined to be, for example, 40 nm, and the thickness of the buried oxide layer necessary for SOI wafer is 400 nm, the oxide film having a thickness of 40 nm can be formed on the bond wafer, in which ions are then implanted, and the resulting wafer can be bonded to the base wafer on which an oxide film having a thickness of 360 nm is formed.

The relation between the deviation in the thickness of the oxide film and the deviation in the ion implantation depth is important for the present invention. Accordingly, the inventors of the present invention studied the deviation in the thickness of the oxide film and the deviation in the ion implantation depth.

The deviation in the thickness of the oxide film was studied as follows. First, each of the oxide films having various thickness was actually formed on the wafer under a general oxidizing condition for mass production. Then, the standard deviation was determined from the thickness distribution in the surface as for each wafer. As a result, the relation between the thickness of the oxide film and the deviation in the thickness of the oxide film was revealed as shown in the line (a) of FIG. 2.

The deviation in the ion implantation depth was studied as follows. First, a wafer having no oxide film was prepared in order to avoid the influence of the oxide film. Then, ions are implanted therein using an apparatus generally used, with inclining a implanting angle at several degree in order to avoid a channeling phenomenon. The resulting wafer was bonded to a wafer on which an oxide film is formed, followed by a heat treatment for delamination at about 500° C. to produce an SOI wafer. The thickness of the resulting SOI wafer was then measured to determine the distribution thereof in the surface. Plural wafers were fabricated with implanting ions therein at various implantation energy, and were determined as for the thickness distribution in the surface as described above. Thereby, the relation between the ion implantation depth and the deviation therein was revealed as shown in the line (b) of FIG. 2.

Figure 2:
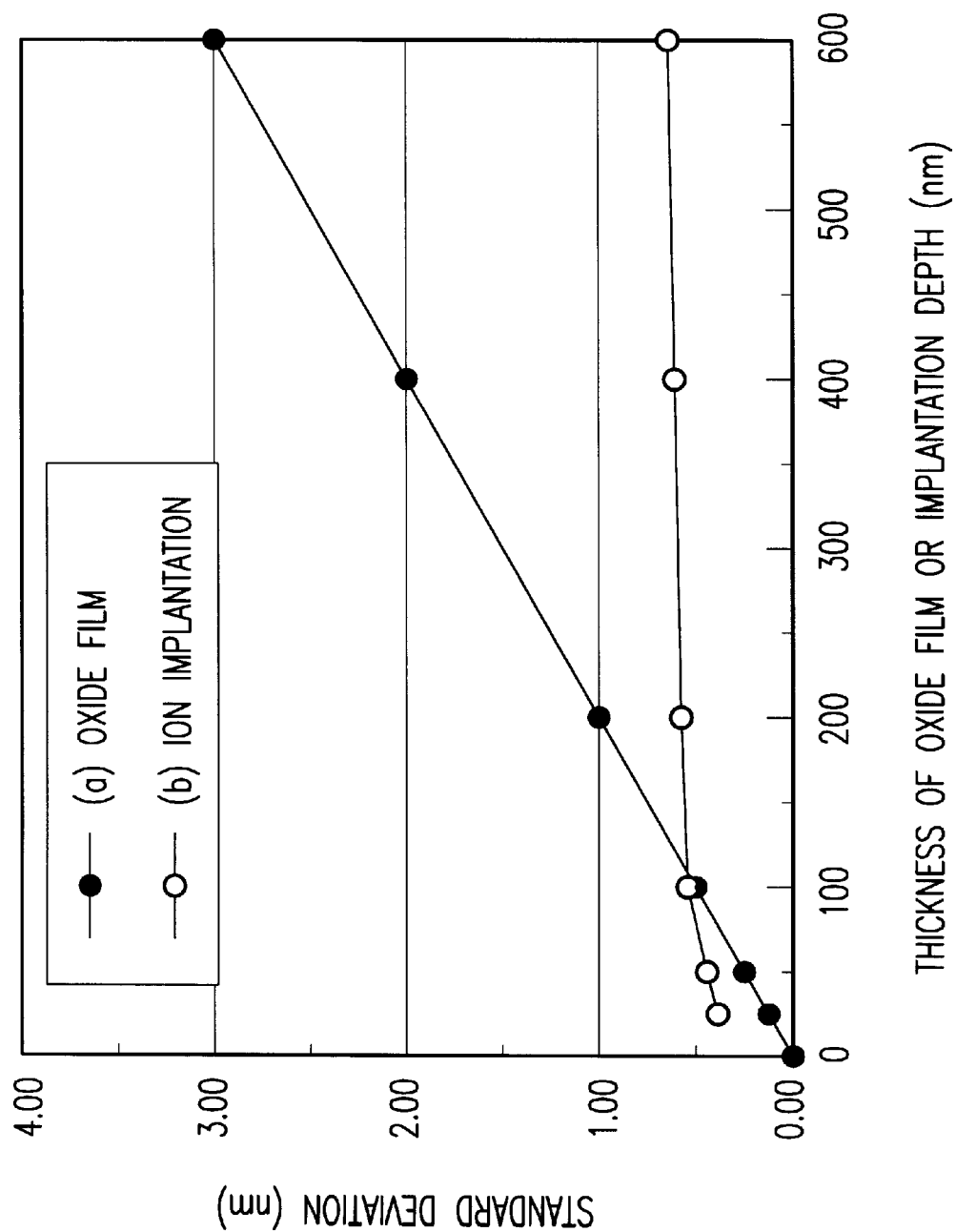
FIG. 2 is a graph showing a result of measurement of a deviation in a thickness of an oxide film and a deviation in an ion implantation depth, which are shown in the same graph. The line (a) shows a relation between the thickness of the oxide film and the deviation therein. The line (b) shows a relation between the ion implantation depth and the deviation therein.

Comparing the deviation in the thickness of the oxide film and the deviation in the ion implantation depth, it is revealed that the deviation in the thickness of the oxide film shown as black circles in the line (a) of FIG. 2 increases in proportion to increase of the thickness of the oixde film formed on the wafer. On the other hand, it is revealed that the deviation in the ion implantation depth shown as white circles in the line (b) of FIG. 2 does not change a lot, and is approximately in the range of 0.4 to 0.6 nm, even when the ion implantation depth increases.

From the relations mentioned above, an appropriate thickness of the oxide film to be formed on the bond wafer can be defined.

Namely, in the relation in FIG. 2 which shows the relation when using the apparatus and the condition generally used for mass production, the thickness of the oxide film formed on the bond wafer is appropriately 100 nm or less in order to make the deviation in the thickness of the oxide film smaller than the deviation in the ion implantation depth.

When the thickness of the oxide film on the bond wafer is thinner, the deviation in the thickness of the oxide film is smaller, so that the influence of the deviation in the thickness of the oxide film on the ion implantation depth gets smaller. However, in order to prevent channeling effect which is one of the reasons why the oxide film is formed on the bond wafer, the thickness of the oxide film of at least 10 nm is necessary. Accordingly, when the SOI wafer is actually fabricated, the thickness of the oxide film formed on the bond wafer is preferably 10 to 100 nm.

In that case, even when the deviation in the thickness of the oxide film and the deviation in the ion implantation depth are changed depending on the ion implanter or conditions such as the condition for formation of the oxide film, the deviations therein can be studied as described above, to make the deviation in the thickness of the oxide film smaller than the deviation in the ion implantation depth.

The embodiment of the present invention will be further described below, referring a figure, but is not limited thereto.

FIG. 1 is a flowchart showing an example of an SOI wafer fabricating process according to a method of fabricating an SOI wafer of the present invention.

In Step (a) of the ion implantation—delamination method shown in FIG. 1, two mirror wafers, namely a base wafer 1 to be a base and a bond wafer 2 to form an SOI layer 8, which are suitable for device specifications are prepared.

In Step (b), the bond wafer 2 is subjected to thermal oxidation so as to form on the surface thereof an oxide film 3 having a thickness of 10 to 100 nm. As described above, if the thickness of the oxide film is in the range, the deviation therein can be smaller than the deviation in the ion implantation depth, so that thickness of the SOI layer 8 can be made uniform.

In Step (c), the base wafer 1 is subjected to thermal oxidation so as to form on the surface thereof an oxide film 5. The thickness of the oxide film 5 formed on the base wafer is defined so that it can provide a buried oxide layer 9 having a desired thickness for the SOI wafer together with the oxide film 3 formed on the bond wafer. If the desired thickness of the buried oxide layer for the SOI wafer can be obtained only by the thickness of the oxide film 3 formed on the bond wafer, it is not necessary to form the oxide film on the base wafer. In that case, Step (c) is omitted. In Step (d), hydrogen ions or rare gas ions are implanted into one surface of the bond wafer 2 having the oxide film formed on the surface thereof, in order to form a fine bubble layer (enclosed layer) 4 which lies in parallel to the surface at a position corresponding to the mean depth of ion implantation. The implantation temperature is preferably 25–450° C.

In Step (e), the base wafer 1 is superposed on the ion-implanted surface of the bond wafer 2 in which hydrogen ions or rare gas ions are implanted, via the oxide film 3, or via the oxide film 3 and the oxide film 5, and they are brought in close contact with each other. When the surfaces of the two wafers are brought into contact with each other at ambient temperature in a clean atmosphere, the wafers are bonded to each other without use of adhesive or the like.

In Step (f), there is performed a heat treatment for delamination in which the delamination wafer 6 is delaminated from the SOI wafer 7 (composed of the SOI layer 8, a buried oxide layer 9, and the base wafer 1) at the enclosed layer 4. The heat treatment is performed at a temperature of about 500° C. or higher in an inert gas atmosphere so as to cause crystal rearrangement and bubble cohesion, and thereby the delamination wafer 6 is delaminated from the SOI wafer 7.

In Step (g), the SOI wafer 7 is subjected to heat treatment at high temperature as a bonding heat treatment in order to improve bonding strength to a sufficient level, since the bonding strength of the wafers imparted in Steps (e) and (f), the bonding step and the delamination heat treatment step, is too low to use in a device process. Preferably, this heat treatment is performed, for example, in an inert gas atmosphere at 1050–1200° C. for 30 minutes to 2 hours.

The Step (f) as a delamination heat treatment step and Step (g) as a bonding heat treatment step may be successively performed. Alternatively, a single heat treatment serving as both of Step (f) as a delamination heat treatment step and Step (g) as a bonding heat treatment step may be performed.

In step (h), a mirror polishing process called touch polishing wherein a stock removal is very small is then performed to remove a crystal defect layer on a delaminated surface which is a surface of the SOI layer 8 and improve the surface roughness.

The SOI wafer 7 of high quality having the buried oxide layer 9 with a desired thickness and the SOI layer 8 with high thickness uniformity can be produced (step (i)) through the steps described above.

EXAMPLES

The following examples and a comparative example are being submitted to further explain the present invention. These examples are not intended to limit the scope of the present invention.

Example 1

Two silicon mirror wafers of conductive type p having a resistivity of 20Ω·cm and a diameter of 150 mm were prepared. These wafers were processed through Steps (a) to (f) shown in FIG. 1 to delaminate a portion of the bond wafer, and thereby provide SOI wafers.

The major process conditions for fabricating SOI wafers were as follows.
1) Thickness of the oxide film on the base wafer: 350 nm;
2) Thickness of the oxide film on the bond wafer: 50 nm;
3) Deviation in the thickness of the oxide film on the bond wafer: σ=0.25 nm;
4) Condition of ion implantation: H$^+$ ions, implantation energy: 80 keV, implantation dose: $8\times10^{16}$/cm$^2$;
5) Ion implantation depth: 700 nm (thickness of the SOI layer+thickness of the oxide film on the bond wafer);
6) Deviation in the ion implantation depth: σ=0.4 nm.

In Example 1, the deviation σ in the thickness of the oxide film on the bond wafer was small as 0.25 nm, compared with the deviation in the ion implantation depth (σ=0.4 nm). The thickness of the oxide film on the bond wafer was measured by spectral reflectance measurement at several thousands points in 2 mm pitch on the surface. The conditions were set so that the thickness of the buried oxide layer may be 400 nm.

The two wafers were stacked under the above condition (FIG. 1(e)), and was subjected to the delamination heat treatment in a N$_2$ gas atmosphere, at 500° C. for 30 minutes (FIG. 1(f)).

The deviation in the thickness of the SOI layer of the SOI wafer after the delamination step were determined to evaluate the thickness uniformity. The thickness of the SOI layer was measured by spectral reflectance measurement at several thousands points in 2 mm pitch on the surface.

As a result, the deviation a was 0.47 nm, and thus 3σ was 1.41 nm. Accordingly, the thickness of the SOI layer is about 650 nm±1.41 nm, which shows significantly improved thickness uniformity of the SOI layer, compared with the thickness uniformity of the conventional SOI wafer, the intended thickness ±3 nm.

Example 2

Two silicon mirror wafers of conductive type p having a resistivity of 20Ω·cm and a diameter of 150 mm were prepared. These wafers were processed through Steps (a) to (f) shown in FIG. 1 to delaminate a portion of the bond wafer, and thereby provide SOI wafers.

The major process conditions for fabricating SOI wafers were as follows.

1) Thickness of the oxide film on the base wafer: 360 nm;
2) Thickness of the oxide film on the bond wafer: 40 nm;
3) Deviation in the thickness of the oxide film on the bond wafer: σ=0.20 nm;
4) Condition of ion implantation: H$^+$ ions, implantation energy: 39 keV, implantation dose: $8\times10^{16}$/cm$^2$;
5) Ion implantation depth: 340 nm (thickness of the SOI layer+thickness of the oxide film on the bond wafer);
6) Deviation in the ion implantation depth: σ=0.4 nm.

In Example 2, the deviation (σ in the thickness of the oxide film on the bond wafer is small as 0.20 nm, compared with the deviation in the ion implantation depth (σ=0.4 nm). The thickness of the oxide film on the bond wafer was measured in the similar manner to that of Example 1. The conditions were set so that the thickness of the buried oxide layer may be 400 nm.

The two wafers were stacked under the above condition (FIG. 1(e)), and is subjected to the delamination heat treatment in a N$_2$ gas atmosphere, at 500° C. for 30 minutes (FIG. 1(f)).

The deviation in the thickness of the SOI layer of the SOI wafer after the delamination step was determined in the similar manner to that of Example 1.

As a result, the deviation σ was 0.45 nm, and thus 3σ is 1.35 nm. Accordingly, the thickness of the SOI layer is about 300 nm±1.35 nm, which shows significantly improved thickness uniformity of the SOI layer, compared with the thickness uniformity of the conventional SOI wafer, the intended thickness ±3 nm.

Example 3

Two silicon mirror wafers of conductive type p having a resistivity of 20Ω·cm and a diameter of 150 mm were prepared. These wafers were processed through Steps (a) to (f) shown in FIG. 1 to delaminate a portion of the bond wafer, and thereby provide SOI wafers (provided that step (c) was omitted).

The major process conditions for fabricating SOI wafers were as follows.
1) Thickness of the oxide film on the base wafer: no oxide film;
2) Thickness of the oxide film on the bond wafer: 50 nm;
3) Deviation in the thickness of the oxide film on the bond wafer: σ=0.25 nm;
4) Condition of ion implantation: H$^+$ ions, implantation energy: 20 keV, implantation dose: $8\times10^{16}$/cm$^2$;
5) Ion implantation depth: 180 nm (thickness of the SOI layer+thickness of the oxide film on the bond wafer);
6) Deviation in the ion implantation depth: σ=0.4 nm.

In Example 3, the deviation σ in the thickness of the oxide film on the bond wafer was small as 0.25 nm, compared with the deviation in the ion implantation depth (σ=0.4 nm). Since the conditions were set so that the thickness of the buried oxide layer may be 50 nm, the oxide film was not formed on the base wafer. The thickness of the oxide film was measured in the similar manner to that of Example 1.

The two wafers were stacked under the above condition (FIG. 1(e)), and is subjected to the delamination heat treatment in a N$_2$ gas atmosphere, at 500° C. for 30 minutes (FIG. 1(f)).

The deviation in the thickness of the SOI layer of the SOI wafer after the delamination step were determined in the similar manner to that of Example 1.

As a result, the deviation σ was 0.47 nm, and thus 3σ was 1.41 nm. Accordingly, the thickness of the SOI layer was about 130 nm±1.41 nm, which shows significantly improved thickness uniformity of the SOI layer, compared with the thickness uniformity of the conventional SOI wafer, the intended thickness ±3 nm.

Comparative Example

Two silicon mirror wafers of conductive type p having a resistivity of 20Ω·cm and a diameter of 150 mm were prepared. A portion of the bond wafer was delaminated to provide an SOI wafer according to the conventional fabrication method shown in FIG. 3(B).

The major process conditions for fabricating SOI wafers were as follows.

1) Thickness of the oxide film on the base wafer: no oxide film;
2) Thickness of the oxide film on the bond wafer: 400 nm;
3) Deviation in the thickness of the oxide film on the bond wafer: σ=2.0 nm;
4) Condition of ion implantation: $H^+$ ions, implantation energy: 80 keV, implantation dose: $8 \times 10^{16}/cm^2$;
5) Ion implantation depth: 700 nm (thickness of the SOI layer+thickness of the oxide film on the bond wafer);
6) Deviation in the ion implantation depth: σ=0.4 nm.

In Comparative Example, the deviation σ in the thickness of the oxide film on the bond wafer was large as 2.0 nm, compared with the deviation in the ion implantation depth (σ=0.4 nm). The thickness of the buried oxide film was 400 nm. The oxide film was formed only on the bond wafer, not on the base wafer. The thickness of the oxide film was measured in the similar manner to that of Example 1.

The two wafers were stacked under the above condition (FIG. 3(*d*)), and is subjected to the delamination heat treatment in a $N_2$ gas atmosphere, at 500° C. for 30 minutes (FIG. 3(*e*)).

The deviation in the thickness of the SOI layer of the SOI wafer after the delamination step were determined in the similar manner to that of Example 1.

As a result, the deviation σ was 2.04 nm, and thus 3σ is 6.12 nm. Accordingly, the thickness of the SOI layer is about 300 nm±6.12 nm, which shows far inferior thickness uniformity of the SOI layer, compared with the intended thickness ±1.5 nm which is an expected value from the deviation in the ion implantation depth σ=0.4 nm.

The present invention is not limited to the above-described embodiment. The above-described embodiment is a mere example, and those having substantially the same structure as that described in the appended claims and providing the similar action and effects are all included in the scope of the present invention.

For example, the process of fabricating the SOI wafer according to the present invention is not limited to that shown in FIG. 1. Other processes such as cleaning, heat treatment or the like can be added thereto. Furthermore, the order of the processes can be partly changed or omitted depending on the purpose.

Furthermore, in the above description, it is mainly explained as for the case that the thickness of the oxide film formed on the bond wafer is made thin to make the deviation in the thickness of the oxide film formed on the bond wafer smaller than the deviation in the ion implantation depth. However, the present invention is not limited thereto. It is possible to make the deviation in the thickness of the oxide film smaller than the deviation in the ion implantation depth by modifying other conditions than the thickness of the oxide film. For example, it is possible to make the deviation in the thickness of the oxide film smaller than the deviation in the ion implantation depth by modifying other conditions for formation of the oxide film than the thickness of the oxide film.

What is claimed is:

1. An SOI wafer produced by bonding two wafers which has a bonded surface in a buried oxide layer, or between the buried oxide layer and a base wafer, and thickness uniformity of an SOI layer is ±1.5 nm or less.

* * * * *